(12) United States Patent
Bae et al.

(10) Patent No.: US 6,815,361 B1
(45) Date of Patent: Nov. 9, 2004

(54) METHOD OF FABRICATING ANTI-STICTION MICROMACHINED STRUCTURES

(75) Inventors: Ki-deok Bae, Kyungki-do (KR); Yong-seop Yoon, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/976,316

(22) Filed: Oct. 15, 2001

(30) Foreign Application Priority Data

May 30, 2001 (KR) ........................................ 2001-30085

(51) Int. Cl.$^7$ ............................................ H01L 21/302
(52) U.S. Cl. ...................... 438/706; 438/710; 438/712; 438/745; 216/2
(58) Field of Search ................................ 438/706, 710, 438/712, 745, 750, 51, 52; 216/2, 27

(56) References Cited

U.S. PATENT DOCUMENTS

| | | | | |
|---|---|---|---|---|
| 5,638,946 A | * | 6/1997 | Zavracky | 200/181 |
| 5,683,591 A | * | 11/1997 | Offenberg | 216/2 |
| 6,096,149 A | * | 8/2000 | Hetrick et al. | 156/155 |
| 6,133,670 A | * | 10/2000 | Rodgers et al. | 310/309 |
| 6,276,205 B1 | * | 8/2001 | McNie et al. | 73/504.13 |
| 6,404,028 B1 | * | 6/2002 | Hetrick et al. | 257/415 |

* cited by examiner

*Primary Examiner*—Lan Vinh
(74) *Attorney, Agent, or Firm*—Sughrue Mion, PLLC

(57) ABSTRACT

A method of fabricating micro-electromechanical system (MEMS) structures that can prevent stiction between a microstructure and a substrate or adjacent structures after etching for releasing the microstructure is provided. In a micromaching process for fabricating a microstructure suspended above a substrate using a sacrificial layer, the fabricating method includes stacking an anti-stiction layer, which can be removed by dry etching, before or after stacking a sacrificial layer.

5 Claims, 2 Drawing Sheets

METHOD OF FABRICATING ANTI-STICTION MICROMACHINED STRUCTURES

BACKGROUND OF THE INVENTION

1. Field of the Invention

The present invention relates to a method of fabricating micro-electromechanical system (MEMS) structures and, more particularly, to a microstructure fabricating method for preventing stiction between a micromachined structure and a substrate or adjacent structures after an etching process for releasing the micromachined structure.

2. Description of the Related Art

As shown in FIG. 1, an MEMS structure commonly referred to as a "microstructure" is fabricated by wet etching for releasing a portion of a microstructure 106 from a substrate 100 and creating a "suspended" microstructure having a space or gap 110 between a released portion 104 and the substrate 100 and one or more posts 102 attached to the substrate 100. The microstructure 106 including the released portion 104 takes the form of a beam or plate having top and A; bottom surfaces which are suspended to be substantially parallel with the surface of the substrate 100. Examples of a device having the suspended microstructure 106 may include accelerometers, pressure sensors, flow sensors, transducers, and microactuators. The term microstructure in this specification collectively refers to a structure fabricated by an MEMS fabrication technology including but not limited to photolithography, thin film deposition, bulk micromachining, surface micromachining, and etching.

A release etching method has two types of processes: a process to create a cavity in the substrate 100 ("bulk micromachining") and a process to remove a sacrificial layer at an intermediate portion of the microstructure 106 and the substrate 100 ("surface micromachining"). In both micromachining processes, the released portion 104 of the microstructure 106 often permanently sticks to the substrate 100 or adjacent structures during post-etch cleaning and drying steps as shown in 108 of FIG. 1.

More specifically, in the surface micromachining technique for creating the released portion 104 of the microstructure 106, a sacrificial layer is removed by common wet etching. In this case, the substrate 100 is exposed to a chemical etching solution for decomposing only the sacrificial layer not affecting a material of the microstructure 106 and then cleaned with a cleaning solution. When removing the cleaning solution, the surface tension of the solution affects the released portion 104 of the suspended microstructure 106 to adhere the bottom surface of the released portion 104 to the substrate 100 or adjacent other structures as shown in 108 of FIG. 1. The adhesion is called "stiction." This stiction degrades the sensitivity of a sensor. Furthermore, severe stiction results in failure in device fabrication and consequently drops a micromachining process yield rate.

A variety of techniques have been developed to avoid stiction. One technique is to reduce the contact area between a released portion and a substrate as much as possible. Another technique is to solidify and sublimate an etching cleaning solution which is the cause of the surface tension between the released portion of the microstructure and the substrate. Similar to this technique, as disclosed in G. T. Mulhern et al., Proc. Int. Conf. Solid State Sensors & Actuators (Transducers '93), Yokohama, 1993 (IEEJ, Tokyo, 1993) p. 296, a pressure-controlled and temperature-controlled chamber is used to sublimate a cleaning solution in its supercritical state.

The above methods for preventing stiction suffer from drops in a yield rate and require additional fabrication steps and expensive equipment. Furthermore, the stiction due to surface tension forces may be basically removed by dry etching, but use of the dry etching may damage the material of a suspended microstructure such as polycrystalline silicon. Furthermore, none of the above methods prevents stiction due to an elastic force other than surface tension.

SUMMARY OF THE INVENTION

To solve the above problems, it is an aspect of the present invention to provide a method for fabricating a microstructure that can prevent stiction of a microstructure to a substrate during a microstructure fabrication process in a simple way.

Accordingly, the present invention provides a method of fabricating a micromachined structure suspended above a substrate using a sacrificial layer. The method includes the step of stacking an anti-stiction layer that can be removed by dry etching before or after stacking the sacrificial layer.

The anti-stiction layer, which may be formed of polymer, polycrystalline silicon or photoresist that can be removed by dry etching, is formed on the substrate. However, the anti-stiction layer may be formed after stacking the sacrificial layer.

If the anti-stiction layer is formed on the substrate before stacking the sacrificial layer, the sacrificial layer and the microstructure are sequentially formed on the anti-stiction layer. The sacrificial layer is removed by wet etching. In this case, the anti-stiction layer is removed by dry etching, thus providing a microstructure without stiction.

BRIEF DESCRIPTION OF THE DRAWINGS

The above aspects and advantages of the present invention will become more apparent by describing in detail an exemplary embodiment thereof with reference to the attached drawings, in which.

DETAILED DESCRIPTION OF THE INVENTION

Figure 1:
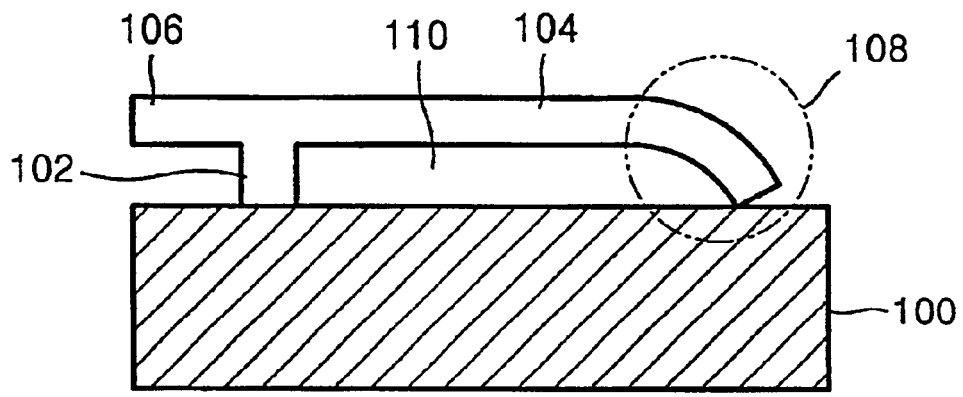
FIG. 1 shows stiction of a micromachined structure.
Figure 2A:
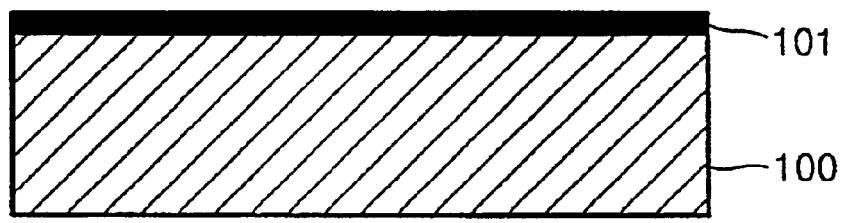
FIGS. 2A–2E show process steps of a method of fabricating an anti-stiction micromachined structure according to an embodiment of the present invention.

Referring to FIG. 2A, a substrate 100 having a predetermined shape formed of an appropriate material such as silicon is prepared. Then, a dry-etchable material such as polymer or polycrystalline silicon ("polysilicon") is deposited on the substrate to a thickness of about 3 μm to form an anti-stiction layer 101. For example, the anti-stiction layer may be Accuflo, SOG, or photoresist. In this embodiment, the photoresist 101 is used as the dry-etchable material.

Figure 2B:
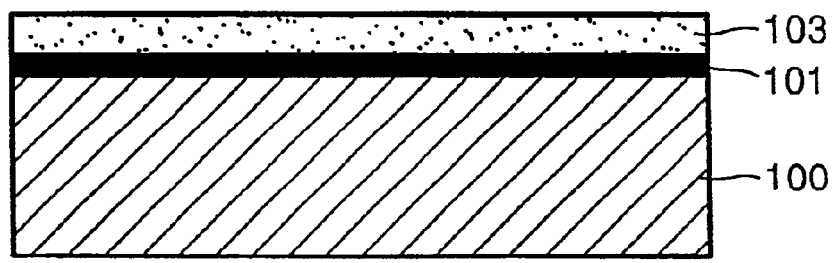
Figure 2C:
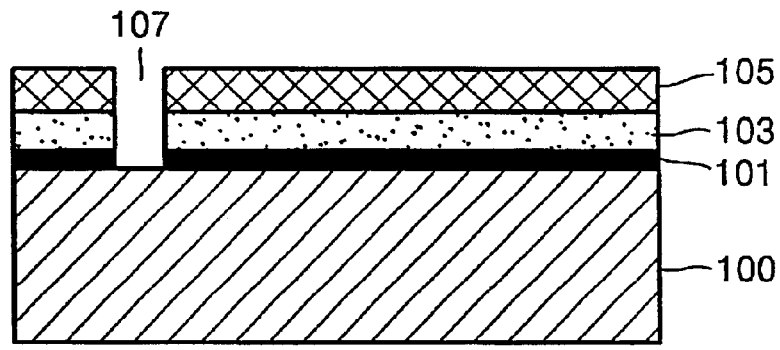
Figure 2D:
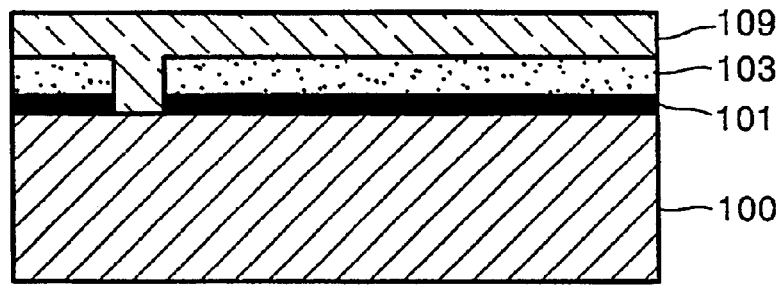

Subsequently, as shown in FIG. 2B, phosphosilicate glass (PSG), silicon oxide, low temperature oxide, copper, iron, molybdenum, nickel, chrome, or tetraethylorthosilicate glass (TEOS) is deposited on the photoresist 101 in order to form a sacrificial layer 103. Then, as shown in FIG. 2C, using Al as an etch mask 105, the anti-stiction layer such as photoresist 101 and the sacrificial layer 103 stacked on the substrate 100 are etched to form a hole 107 for a post. Then, as shown in FIG. 2D, polysilicon 109, which will be a micromachined structure ("microstructure"), is deposited over the resulting structure from which the mask 105 has been removed.

Figure 2E:
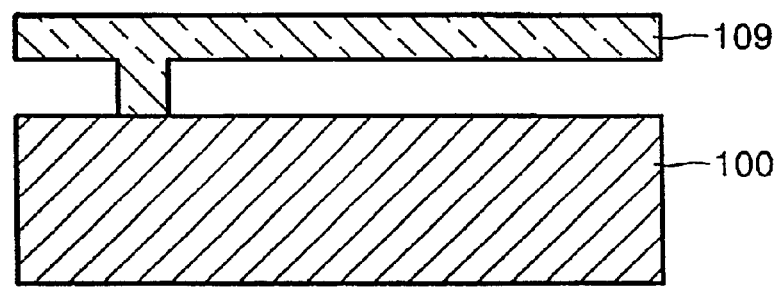

Referring to FIG. 2E, the sacrificial layer 103 is removed by an etching solution such as a hydrogen fluoric (HF) solution in order to form a released portion of a suspended microstructure 109. The photoresist 101 deposited on the substrate 100 is removed by isotropic dry etching, thereby fabricating the suspended microstructure 109 having the release portion without stiction to the substrate 100.

As described above, the fabricating method according to the present invention is able to prevent stiction that may occur in removing the sacrificial layer 103 through wet etching. Furthermore, dry etching is used to remove the anti-stiction layer 101 while the inexpensive wet etching is used to remove the sacrificial layer 103, thereby manufacturing the microstructure 109 in a cost-effective way.

While this invention has been particularly shown and described with reference to an exemplary embodiment thereof, it will be understood by those skilled in the art that various changes in form and details may be made therein without departing from the spirit and scope of the invention as defined by the appended claims.

For example, although stiction may occur between a microstructure and a substrate or any adjacent structure, the embodiment of the present invention has been described only with respect to stiction occurring between a microstructure and a substrate. It will be understood by those skilled in the art that the present invention is applicable to stiction which may occur between a microstructure and an adjacent microstructure other than a substrate.

Furthermore, while an anti-stiction layer and a sacrificial layer are sequentially deposited on a substrate in the exemplary embodiment of the present invention, the anti-stiction layer may be deposited on the sacrifical layer in order to manufacture a suspended microstructure. Thus, it is contemplated that numerous modifications may be made to the method of the present invention without departing from the spirit and scope of the invention as defined in the following claims.

What is claimed is:

1. A method for fabricating microstructures, the method comprising:

preparing a substrate;

forming an anti-stiction layer on the substrate;

forming a sacrificial layer on the anti-stiction layer;

forming at least one structure layer for creating at least one microstructure on the sacrificial layer; and removing the sacrificial layer by wet etching and removing the anti-stiction layer by dry etching in order to release the at least one microstructure while preventing stiction.

2. The method of claim 1, wherein the anti-stiction layer is formed of one of polymer and polycrystalline silicon.

3. The method of claim 1, wherein the anti-stiction layer is formed of photoresist.

4. The method of claim 1, wherein the sacrificial layer is formed of one selected from the group consisting of phosphosilicate glass (PSG), silicon oxide, low temperature oxide, copper, iron, molybdenum, nickel, chrome, and tetraethylorthosilicate glass (TEOS).

5. A method of fabricating microstructures, the method comprising:

preparing a substrate;

forming a sacrificial layer on the substrate;

forming an anti-stiction layer on the sacrificial layer; and forming at least one structure layer for forming at least one microstructure on the anti-stiction layer and removing the sacrificial layer by wet etching while removing the anti-stiction layer by dry etching in order to release the at least one microstructure while preventing stiction.

* * * * *